United States Patent
Deng et al.

(10) Patent No.: US 11,199,566 B2
(45) Date of Patent: Dec. 14, 2021

(54) NON-FAULT DISTURBANCE-BASED METHOD AND SYSTEM FOR MEASURING SHORT-CIRCUIT CAPACITY OF POWER GRID ON SITE

(71) Applicant: Power Grid Planning Research Institute of Guizhou Power Grid Co., Ltd., Guiyang (CN)

(72) Inventors: Pu Deng, Guiyang (CN); Zhenghang Hao, Guiyang (CN); Zhenming Liu, Guiyang (CN); Yi Xue, Guiyang (CN); Guangmei Zhang, Guiyang (CN); Zhuo Chen, Guiyang (CN); Qingming Zhao, Guiyang (CN); Xueyong Tang, Guiyang (CN); Qingsheng Li, Guiyang (CN); Yu Zhang, Guiyang (CN); Sha Zhang, Guiyang (CN); Xianggang He, Guiyang (CN); Jian Wang, Guiyang (CN); Sibin Lu, Guiyang (CN); Ke Yang, Guiyang (CN)

(73) Assignee: Power Grid Planning Research Institute of Guizhou Power Grid Co., Ltd., Guiyang (CN)

( * ) Notice: Subject to any disclaimer, the term of this patent is extended or adjusted under 35 U.S.C. 154(b) by 533 days.

(21) Appl. No.: 16/150,508

(22) Filed: Oct. 3, 2018

(65) Prior Publication Data

US 2020/0041548 A1    Feb. 6, 2020

(30) Foreign Application Priority Data

Aug. 3, 2018   (CN) .................... 201810875842.X

(51) Int. Cl.
*G01R 19/25* (2006.01)
*G01R 27/16* (2006.01)
(Continued)

(52) U.S. Cl.
CPC ......... *G01R 19/2513* (2013.01); *G01R 27/16* (2013.01); *H02J 3/18* (2013.01); *H02J 13/0006* (2013.01)

(58) Field of Classification Search
CPC ....... G01R 19/2513; G01R 27/16; H02J 3/18; H02J 13/0006
See application file for complete search history.

(56) References Cited

U.S. PATENT DOCUMENTS 6,014,017 A * 1/2000 Weinhold ............. H02J 3/1842
                                                  323/207
7,117,124 B2 * 10/2006 Yamada ............. G05B 23/0235
                                                  702/185

(Continued)

*Primary Examiner* — Arleen M Vazquez
*Assistant Examiner* — Brandon J Becker

(57) ABSTRACT

Non-fault disturbance-based method and system for measuring short-circuit capacity of a power grid on site including: connecting or disconnecting a reactive compensation device to or from a power grid point of common coupling, to generate a disturbance on a power grid; obtaining total active power and total reactive power of a load of the point of common coupling before the disturbance; determining a vector difference between a voltage of the power grid point of common coupling before the disturbance and a voltage of the power grid point of common coupling after the disturbance; obtaining a voltage effective value of the power grid point of common coupling before the disturbance; obtaining a capacity of the reactive compensation device; and determining a short-circuit capacity of the point of common coupling according to total active power, total reactive power, vector difference between voltages, voltage effective value, and capacity of the reactive compensation device.

6 Claims, 9 Drawing Sheets

(51) Int. Cl.
  *H02J 3/18*    (2006.01)
  *H02J 13/00*   (2006.01)

(56) References Cited

U.S. PATENT DOCUMENTS

| | | | |
|---|---|---|---|
| 10,386,808 B2* | 8/2019 | Tian | G05B 19/042 |
| 10,481,562 B2* | 11/2019 | Jahanshahi | G05B 13/024 |
| 2004/0071000 A1* | 4/2004 | Escobar | H02J 3/1842 |
| | | | 363/63 |
| 2006/0036388 A1* | 2/2006 | Swarztrauber | G01R 19/2513 |
| | | | 702/107 |
| 2008/0114472 A1* | 5/2008 | Lee | G05B 11/42 |
| | | | 700/37 |
| 2012/0283967 A1* | 11/2012 | Duan | H02J 13/00002 |
| | | | 702/60 |
| 2013/0322139 A1* | 12/2013 | Lee | H02M 7/219 |
| | | | 363/84 |
| 2014/0229127 A1* | 8/2014 | Ren | G01R 31/088 |
| | | | 702/59 |
| 2016/0079757 A1* | 3/2016 | Matan | H02J 13/00 |
| | | | 307/24 |
| 2016/0139188 A1* | 5/2016 | Harary | H02J 13/00034 |
| | | | 702/61 |

* cited by examiner

NON-FAULT DISTURBANCE-BASED METHOD AND SYSTEM FOR MEASURING SHORT-CIRCUIT CAPACITY OF POWER GRID ON SITE

CROSS-REFERENCE TO RELATED APPLICATIONS

This application claims priority to Chinese application number 201810875842.X, filed on Aug. 3, 2018, entitled "NON-FAULT DISTURBANCE-BASED METHOD AND SYSTEM FOR MEASURING SHORT-CIRCUIT CAPACITY OF POWER GRID ON SITE", which is incorporated herein by reference in its entirety.

BACKGROUND OF THE INVENTION

1. Field of Invention

The present invention relates to the field of equipment for analyzing and measuring a power system status online, and in particular, to a non-fault disturbance-based method and system for measuring a short-circuit capacity of a power grid on site.

2. Background of Related Art

A short-circuit capacity is one of the most important technical parameters of a power system, and this parameter is needed in a relay protection specialty to convert a short-circuit impedance and perform appropriate tuning, so as to ensure a correct action of a protection apparatus and ensure safe running of a power grid. Primary equipment, such as a circuit breaker, must ensure that an interrupting capacity is greater than a short-circuit current, a main transformer also needs such a parameter, that is, a system short-circuit capacity. Similarly, a system short-circuit capacity or short-circuit current parameter is also needed in power quality testing and analysis, new energy access designing and analysis, and industrial power consumption designing and equipment selection in aspects of railways, metallurgy, coal mining, and manufacturing. That is, system short-circuit capacity (system short-circuit current) data is needed respective stages of planning, designing, constructing and debugging, running, and maintaining a power grid, and is widely needed in respective sectors of planning and construction, production and power supply, and users of the power grid, as well as power generation plants and high-voltage power supplied users.

Moreover, in the prior art, a system short-circuit capacity is obtained by calculating short-circuit capacities of respective nodes in a power system. However, a conventional offline calculation method has many problems: (1) with regard to short-circuit capacity calculation, all power system parameters are needed for performing systemized calculation, which is strongly professional, resulting in that in actual work, maintenance personnel of primary and second equipment can hardly correctly complete calculation work; (2) factors, such as transduction and supply switching of a distribution grid, real-time optimization of a topology, connection to and disconnection from a distributed power supply, and collapse and dropout of a local power grid, result in that offline calculation cannot keep up with a power grid status change, and satisfy real-time demands cannot be satisfied; (3) a power grid has a large data volume, it is difficult to maintain the power grid, and a data error or a calculation mistake or error caused by an accuracy problem can hardly be avoided and found; and (4) since power generation plants and high-power-consumption enterprises do not have complete power grid data, it is difficult to calculate a short-circuit capacity (or short-circuit current), and self-maintenance and tuning of primary and secondary equipment are difficult.

So far, there is still no universal instrument, apparatus, or device capable of measuring a short-circuit capacity of a power grid point of common coupling on site because existing short-circuit capacity measurement methods are not practically applicable. Requirements for practical application of short-circuit capacity measurement include: (1) normal running of power transmission and distribution of a power grid is not affected, (2) during measurement, the power grid is not limited to a specific running manner, (3) measurement cannot be performed in a fault disturbance manner, and (4) a measurement principle should be accurate, that is, the measurement principle does not cause an error, where an error of short-circuit capacity measurement is merely generated from a measurement error of an electrical quantity and a parameter error of a connection device of a point of common coupling.

SUMMARY OF THE INVENTION

An objective of the present invention is to provide a non-fault disturbance-based method and system for measuring a short-circuit capacity of a power grid on site, capable of implementing online measurement of a short-circuit capacity of a power grid point of common coupling and having a feature of high precision.

To achieve the above objective, the present invention provides the following solution: A non-fault disturbance-based method for measuring a short-circuit capacity of a power grid on site, including: connecting or disconnecting a reactive compensation device to or from a power grid point of common coupling, to generate a disturbance on a power grid, where the reactive compensation device is a reactive compensation device of the power grid; obtaining a total active power and a total reactive power of a load of the point of common coupling before the disturbance; determining a vector difference between a voltage of the power grid point of common coupling before the disturbance and a voltage of the power grid point of common coupling after the disturbance; obtaining a voltage effective value of the power grid point of common coupling before the disturbance; obtaining a capacity of the reactive compensation device; and determining a short-circuit capacity of the point of common coupling according to the total active power, the total reactive power, the vector difference between the voltages, the voltage effective value, and the capacity of the reactive compensation device.

Optionally, the determining a vector difference between a voltage of the power grid point of common coupling before the disturbance and a voltage of the power grid point of common coupling after the disturbance specifically includes: obtaining the voltage effective value and a phase of the power grid point of common coupling before the disturbance; obtaining a voltage effective value and a phase of the power grid point of common coupling after the disturbance; and calculating the vector difference between the voltages of the power grid point of common coupling according to $\Delta V = \sqrt{V_1^2 + V_2^2 - 2V_1 V_2 \cos\theta}$, where $\Delta V$ is the vector difference between the voltages of the power grid point of common coupling, $V_1$ is the voltage effective value of the power grid point of common coupling before the disturbance, $V_2$ is the voltage effective value of the power grid point of common coupling after the disturbance, and $\theta$ is a phase difference between the voltage of the power grid point of common coupling before the disturbance and the voltage of the power grid point of common coupling after the disturbance.

Optionally, the determining a short-circuit capacity of the point of common coupling according to the total active power, the total reactive power, the vector difference between the voltages, the voltage effective value, and the capacity of the reactive compensation device specifically includes: calculating the short-circuit capacity of the point of common coupling according to $$S = \sqrt{\left(\frac{V_1}{\Delta V}\right)^2 Q_C^2 - P_L^2} - Q_L + Q_C,$$

where S is the short-circuit capacity of the power grid point of common coupling, $Q_C$ is the capacity of the connected or disconnected reactive compensation device, $P_L$ is the total active power of the load of the point of common coupling, $Q_L$ is the total reactive power of the load of the point of common coupling, and $V_1$ is the voltage effective value of the power grid point of common coupling before the disturbance.

The present invention further provides a non-fault disturbance-based system for measuring a short-circuit capacity of a power grid on site, including: a reactive compensation device operation module, configured to connect or disconnect a reactive compensation device to or from a power grid point of common coupling, to generate a disturbance on a power grid, where the reactive compensation device is a reactive compensation device of the power grid; a power obtaining module, configured to obtain a total active power and a total reactive power of a load of the point of common coupling before the disturbance; a voltage vector difference determining module, configured to determine a vector difference between a voltage of the power grid point of common coupling before the disturbance and a voltage of the power grid point of common coupling after the disturbance; a voltage effective value obtaining module, configured to obtain a voltage effective value of the power grid point of common coupling before the disturbance; a reactive compensation device capacity obtaining module, configured to obtain a capacity of the reactive compensation device; and a power grid point of common coupling short-circuit capacity determining module, configured to determine a short-circuit capacity of the point of common coupling according to the total active power, the total reactive power, the vector difference between the voltages, the voltage effective value, and the capacity of the reactive compensation device.

Optionally, the voltage vector difference determining module specifically includes: a pre-operation voltage obtaining unit, configured to obtain the voltage effective value and a phase of the power grid point of common coupling before the disturbance; a post-operation voltage obtaining unit, configured to obtain a voltage effective value and a phase of the power grid point of common coupling after the disturbance; and a voltage vector difference calculation unit, configured to obtain the vector difference between the voltages of the power grid point of common coupling according to $\Delta V = \sqrt{V_1^2 + V_2^2 - 2V_1V_2 \cos\theta}$, where $\Delta V$ is the vector difference between the voltages of the power grid point of common coupling, $V_1$ is the voltage effective value of the power grid point of common coupling before the disturbance, $V_2$ is the voltage effective value of the power grid point of common coupling after the disturbance, and $\theta$ is a phase difference between the voltage of the power grid point of common coupling before the disturbance and the voltage of the power grid point of common coupling after the disturbance.

Optionally, the power grid point of common coupling short-circuit capacity determining module specifically includes: a power grid point of common coupling short-circuit capacity determining unit, configured to calculate the short-circuit capacity of the point of common coupling according to $$S = \sqrt{\left(\frac{V_1}{\Delta V}\right)^2 Q_C^2 - P_L^2} - Q_L + Q_C,$$

where S is the short-circuit capacity of the power grid point of common coupling, $Q_C$ is the capacity of the connected or disconnected reactive compensation device, $P_L$ is the total active power of the load of the point of common coupling, $Q_L$ is the total reactive power of the load of the point of common coupling before the disturbance, and V is the voltage effective value of the power grid point of common coupling before the disturbance.

According to specific embodiments provided by the present invention, the present invention discloses the following technical effects: in the non-fault disturbance-based method and system for measuring a short-circuit capacity of a power grid on site provided by the present invention, a connected reactive compensation device is connected to or disconnect from a power grid point of common coupling, to generate a disturbance on a power grid; a total active power and a total reactive power of a load of the point of common coupling before the disturbance, as well as amplitude and phase differences between a voltage of the power grid point of common coupling before the disturbance and a voltage of the power grid point of common coupling after the disturbance are measured; and a short-circuit capacity of the point of common coupling is calculated according to the total active power and the total reactive power of the load of the point of common coupling, the amplitude and phase differences between the voltage of the power grid point of common coupling before the disturbance and the voltage of the power grid point of common coupling after the disturbance, and the capacity of the connected or disconnected reactive compensation device, so as to implement online measurement of the short-circuit capacity of the power grid point of common coupling.

In addition, because a formula used for calculating the short-circuit capacity of the power grid point of common coupling in the present invention is derived from a basic physical principle of circuitry and is not an empirical formula, the short-circuit capacity of the power grid point of common coupling calculated in the present invention has an advantage of high precision.

BRIEF DESCRIPTION OF THE DRAWINGS

To describe the technical solutions in the embodiments of the present invention or in the prior art more clearly, the following briefly describes the accompanying drawings required for describing the embodiments. The accompanying drawings in the following description show some embodiments of the present invention, and a person of ordinary skill in the art may still derive other drawings from these accompanying drawings without creative efforts.

DETAILED DESCRIPTION

The following clearly and completely describes the technical solutions in the embodiments of the present invention with reference to the accompanying drawings in the embodiments of the present invention. The described embodiments are merely a part rather than all of the embodiments of the present invention. All other embodiments obtained by a person of ordinary skill in the art based on the embodiments of the present invention without creative efforts shall fall within the protection scope of the present invention.

An objective of the present invention is to provide a non-fault disturbance-based method and system for measuring a short-circuit capacity of a power grid on site, capable of implementing online measurement of a short-circuit capacity of a power grid point of common coupling and having a feature of high precision.

To make the foregoing objective, features, and advantages of the present invention clearer and more comprehensible, the present invention is further described in detail below with reference to the accompanying drawings and specific embodiments.

Figure 1:
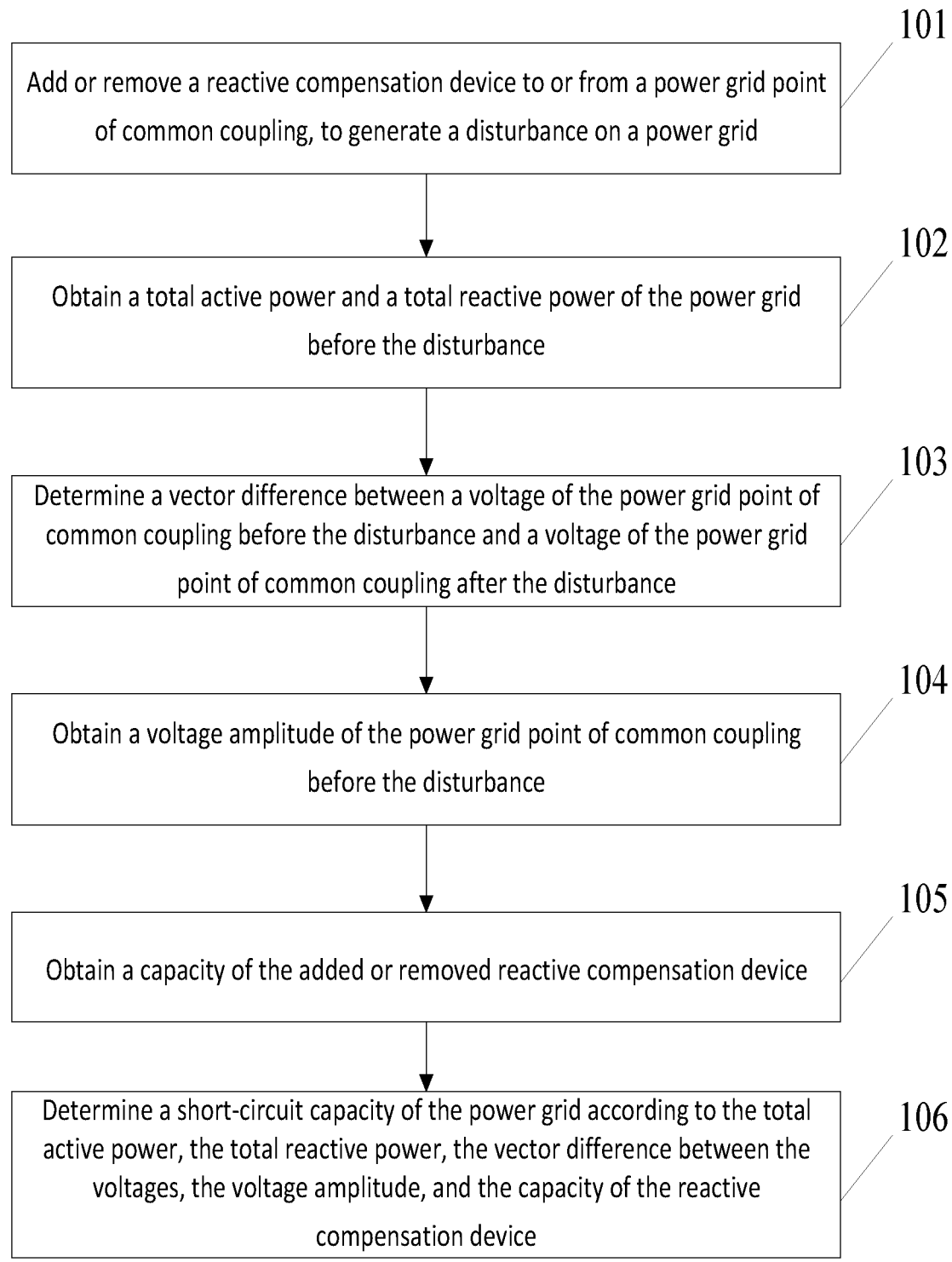
FIG. 1 is a flowchart of a non-fault disturbance-based method for measuring a short-circuit capacity of a power grid on site according to an embodiment of the present invention.

FIG. 1. is a flowchart of a non-fault disturbance-based method for measuring a short-circuit capacity of a power grid on site according to an embodiment of the present invention. As shown in FIG. 1, the non-fault disturbance-based method for measuring a short-circuit capacity of a power grid on site provided by the present invention includes the following steps:

Step 101: Connect or disconnect a reactive compensation device to or from a power grid point of common coupling, to generate a disturbance on a power grid, where the reactive compensation device is a reactive compensation device of the power grid.

Step 102: Obtain a total active power and a total reactive power of a load of the point of common coupling before the disturbance.

Step 103: Determine a vector difference between a voltage of the power grid point of common coupling before the disturbance and a voltage of the power grid point of common coupling after the disturbance.

Step 104: Obtain a voltage effective value of the power grid point of common coupling before the disturbance.

Step 105: Obtain a capacity of the reactive compensation device.

Step 106: Determine a short-circuit capacity of the point of common coupling according to the total active power, the total reactive power, the vector difference between the voltages, the voltage effective value, and the capacity of the reactive compensation device.

Step 103 specifically includes: obtaining the voltage effective value and a phase of the power grid point of common coupling before the disturbance; obtaining a voltage effective value and a phase of the power grid point of common coupling after the disturbance; and calculating the vector difference between the voltages of the power grid point of common coupling according to $\Delta V = \sqrt{V_1^2 + V_2^2 - 2V_1V_2\cos\theta}$, where $\Delta V$ is the vector difference between the voltages of the power grid point of common coupling, $V_1$ is the voltage effective value of the power grid point of common coupling before the disturbance, $V_2$ is the voltage effective value of the power grid point of common coupling after the disturbance, and $\theta$ is a phase difference between the voltage of the power grid point of common coupling before the disturbance and the voltage of the power grid point of common coupling after the disturbance.

Figure 2:
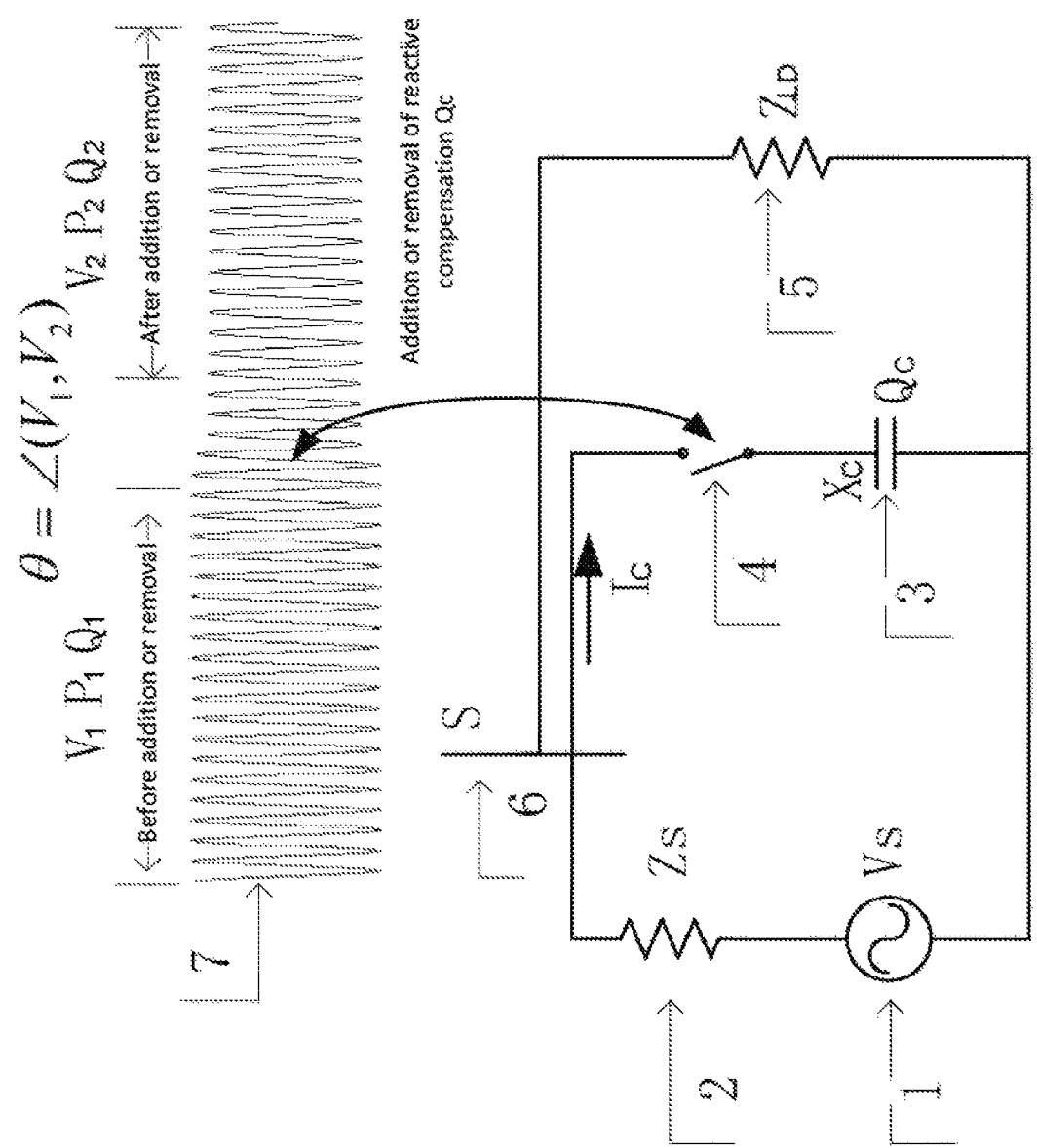
FIG. 2 is a schematic diagram of a basic principle and electrical measurement according to the present invention.

Step 106 specifically includes: calculating the short-circuit capacity of the point of common coupling according to $$S = \sqrt{\left(\frac{V_1}{\Delta V}\right)^2 Q_C^2 - P_L^2} - Q_L + Q_C,$$

where S is the short-circuit capacity of the power grid point of common coupling, $Q_C$ is the capacity of the connected or disconnected reactive compensation device, $P_L$ is the total active power of the load of the point of common coupling, $Q_L$ is the total reactive power of the load of the point of common coupling before the disturbance, and $V_1$ is the voltage effective value of the power grid point of common coupling before the disturbance. In the present invention, a closing or opening operation of a circuit breaker 4 in FIG. 2 is performed to connect or disconnect the reactive compensation device whose capacity is $Q_C$. Connection to and disconnection from the reactive compensation device is used to generate an electrical disturbance. At a power grid point of common coupling (PCC) 6, a voltage $V_1$ at the power grid PCC and an active power $P_1$ and a total reactive power $Q_1$ of the PCC before the operation of the circuit breaker 4 are measured; a voltage $V_2$ at the power grid PCC and a total active power $P_2$ and a total reactive power $Q_2$ of the PCC after the operation of the circuit breaker 4 are measured; and a phase angle difference $\theta$ between the PCC voltages $V_1$ and $V_2$ is measured. A short-circuit capacity S of the power grid PCC is calculated according to the foregoing measured values. The active power and the total reactive power of the PCC almost keep unchanged during an connection or disconnection process of the reactive compensation device and are respectively represented by $P_L$ and $Q_L$. A reactance of the reactive compensation device 3 is $X_C$, the reactive compensation capacity thereof is $Q_C$, and the reactive compensation current thereof is $I_c$, and 7 represents a voltage fluctuation process in the connection or disconnection process of the reactive compensation apparatus. The former time period is a time period before the operation of the circuit breaker, and the voltage $V_1$, the total active power $P_L$, and the total reactive power $Q_L$ of the PCC are measured in this time period. The later time period is a time period after the operation of the circuit breaker, and the voltage $V_2$, the total active power $P_2$ (the same as $P_L$), and the total reactive power $Q_2$ ($Q_2$ $Q_L$-$Q_C$) are measured in this time period. In addition, an angle difference θ between the voltage $V_1$ of the PCC before the operation of the circuit breaker and the voltage $V_2$ of the PCC after the operation is measured.

A derivation process of the formula $$S = \sqrt{\left(\frac{V_1}{\Delta V}\right)^2 Q_C^2 - P_L^2} - Q_L + Q_C$$

is described below: For a transformer substation PCC whose short-circuit capacity needs to be measured, connection to and disconnection from a parallel reactive compensation device at the PCC is used to generate a disturbance. For example, by disconnecting a capacitor manually or automatically, amplitude and phase differences between a voltage of the PCC before connection to and disconnection from the capacitor and a voltage of the PCC after connection to and disconnection from the capacitor, as well as an active power and a reactive power of a PCC feed line are measured. Subsequently, according to a measured value of the PCC voltage before the capacitor is disconnected and a capacity of the disconnected capacitor, a reactive current transmitted by the disconnected capacitor during steady operation of the disconnected capacitor is calculated, and the reactive current is represented by a current source and is used as one of the excitation sources in a circuit topology. A transformer substation model is expressed as a linear circuit model constituted by a Thevenin reactance, a voltage source after the Thevenin reactance, a capacitor-equivalent current source, and an impedance element obtained from a load power. Finally, the circuit model is divided into two linear circuits: one is separately excited by a voltage source, and the other is separately excited by a current source. A voltage change amount of a to-be-measured PCC caused by separate acting of the current source is measured according to a vector triangle, so that the Thevenin reactance and the short-circuit capacity of the to-be-measured PCC can be further calculated.

Figure 3:
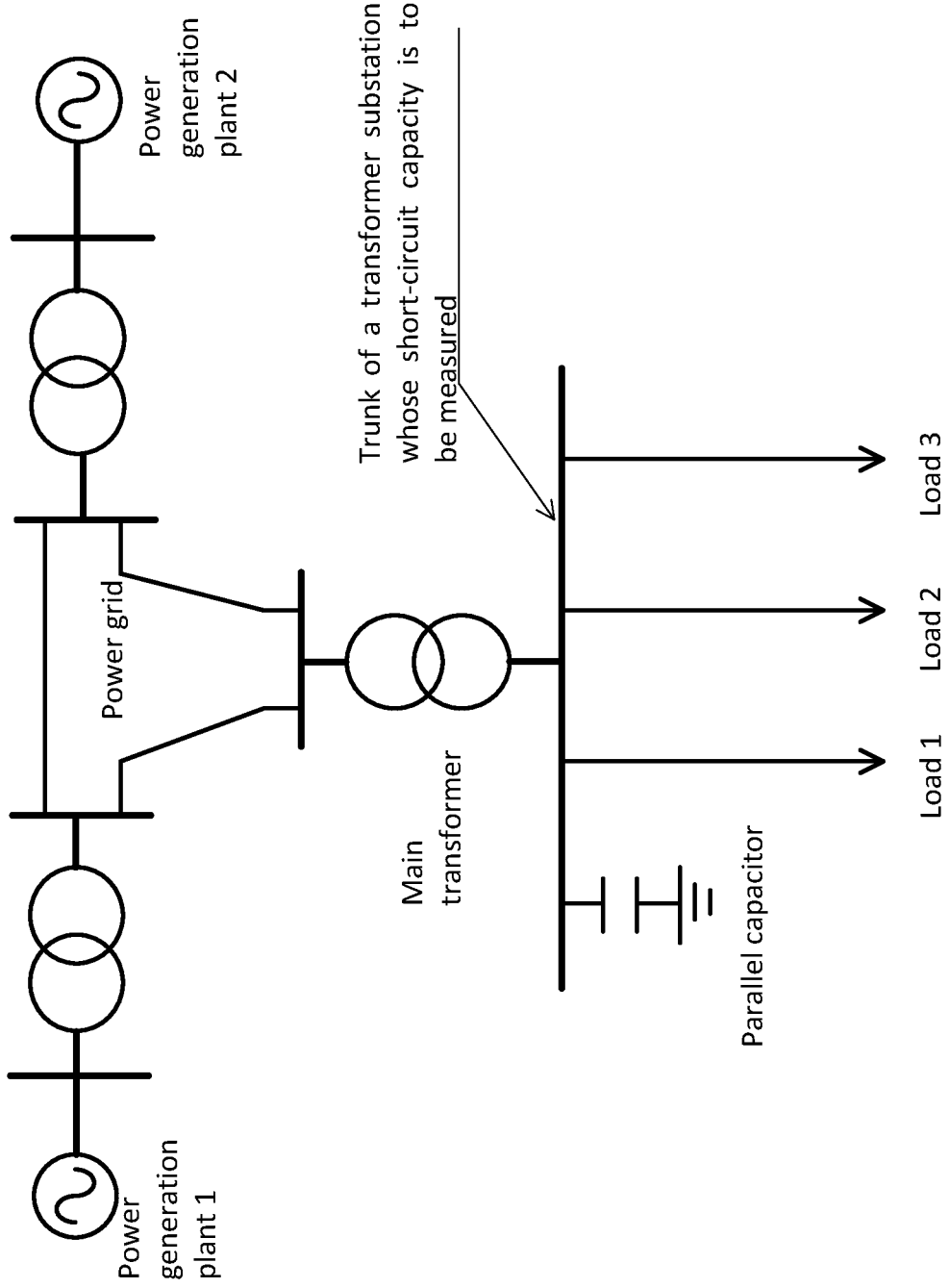
FIG. 3 is illustration of an application scenario according to an embodiment of the present invention.

Based on a power system and its transformer substation under the general meaning shown in FIG. 3, a circuit model thereof is constructed as shown in FIG. 3, where $E_S$ is an intra-system potential and may be a power grid rated voltage, $Z_{LD}$ is an impedance calculated according to all loads at the PCC, and calculation formulas are as follows:

$$\frac{1}{Z_{LD}} = \frac{P_L}{E_S^2} + j\frac{Q_L}{E_S^2} \quad (1)$$

$$\frac{1}{Z_S} = j\frac{S}{E_S^2} \quad (2)$$

In formula (1) and formula (2), $E_S$ is a rated voltage, $P_L$ and $Q_L$ are active and reactive powers of all loads at the PCC at the rated voltage before the capacitor is disconnected, and S is a short-circuit capacity of the PCC.

Figure 4:
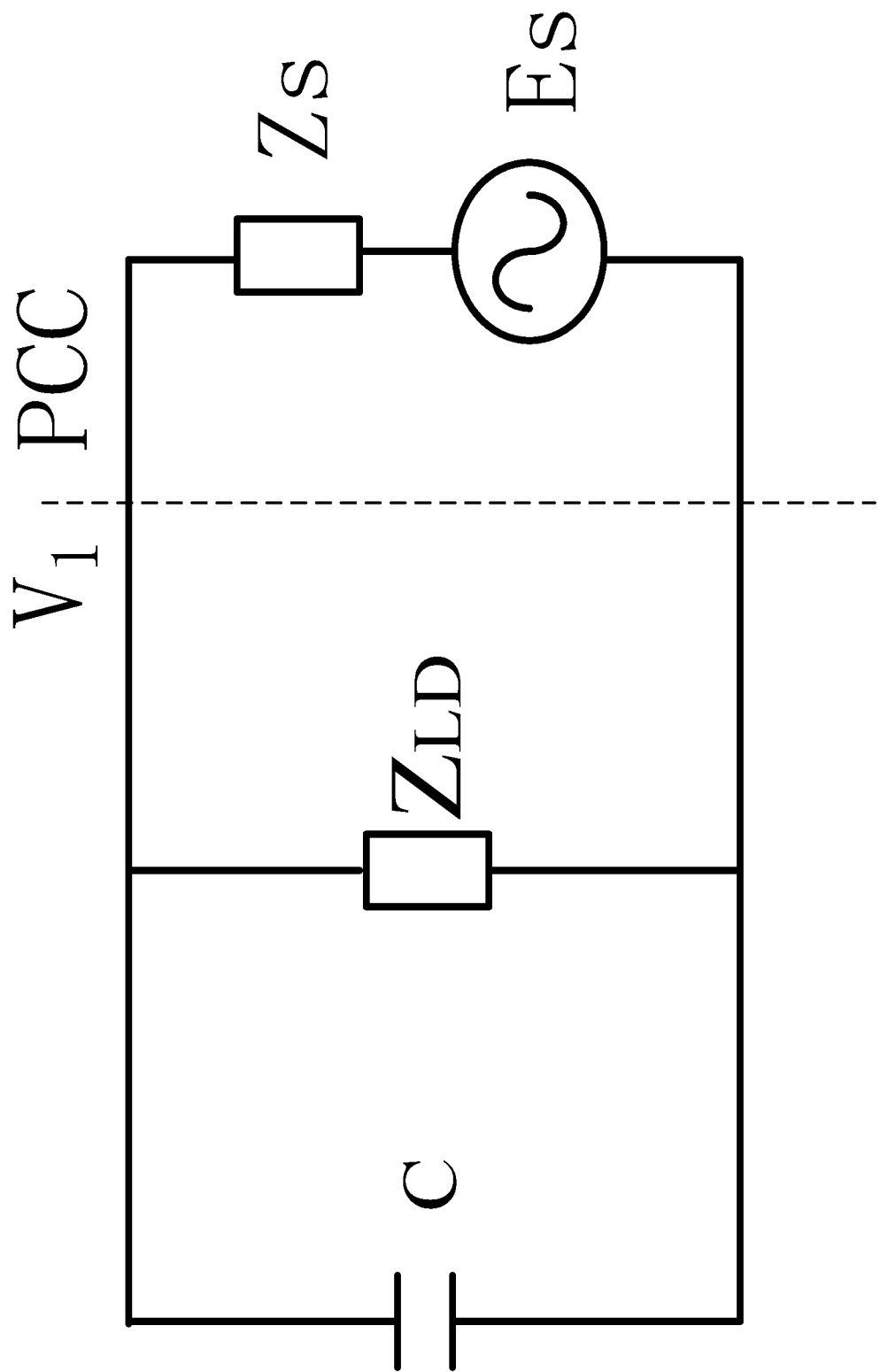
FIG. 4 is a schematic circuit diagram of an application scenario according to the present invention.
Figure 5:
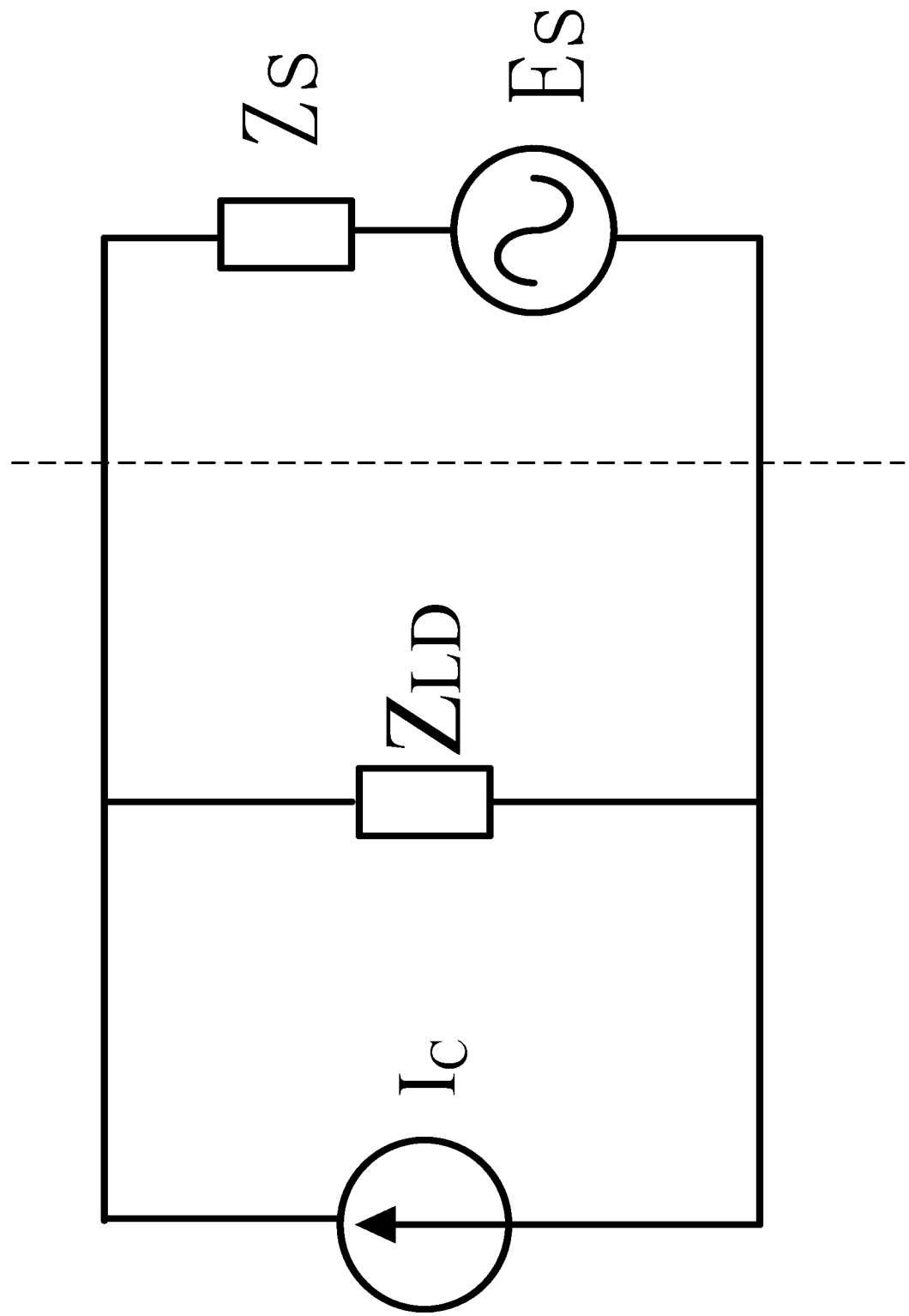
FIG. 5 is a schematic circuit diagram of replacing a capacitor with a current source according to the present invention.

In the present invention, in principle, the capacitor is represented by a current source in a steady working status, a magnitude of the current equals a current capacitor current, and a capacitor element is represented by a current source $I_C$. According to a replacement principle, the circuit model in FIG. 4 is converted into a circuit model in FIG. 5. $I_C$ is calculated according to formula:

$$I_C = \frac{V_1}{X_C} = \frac{Q_C V_1}{E_S^2} \quad (3)$$

In formula (3), $Q_C$ is a rated capacity of the capacitor, $E_S$ is a rated voltage, $V_1$ is an actual voltage before the capacitor is disconnected, and $X_C$ is a reactance.

According to a measured voltage effective value $V_1$ of the PCC before the disturbance, a measured voltage effective value $V_2$ of the PCC after the disturbance, a phase difference θ formed by using the voltage of the PCC before the disturbance and the voltage of the PCC after the disturbance, and a measured value of the phase difference θ, a vector difference $\Delta V$ formed between a voltage vector before a parallel connection disturbance and a voltage vector after connection or disconnection is calculated, where a calculation formula of $\Delta V$ is $\Delta V = \sqrt{V_1^2 + V_2^2 - 2V_1 V_2 \cos\theta}$, and a short-circuit capacity of the PCC is calculated according to the vector difference $\Delta V$.

Figure 6:
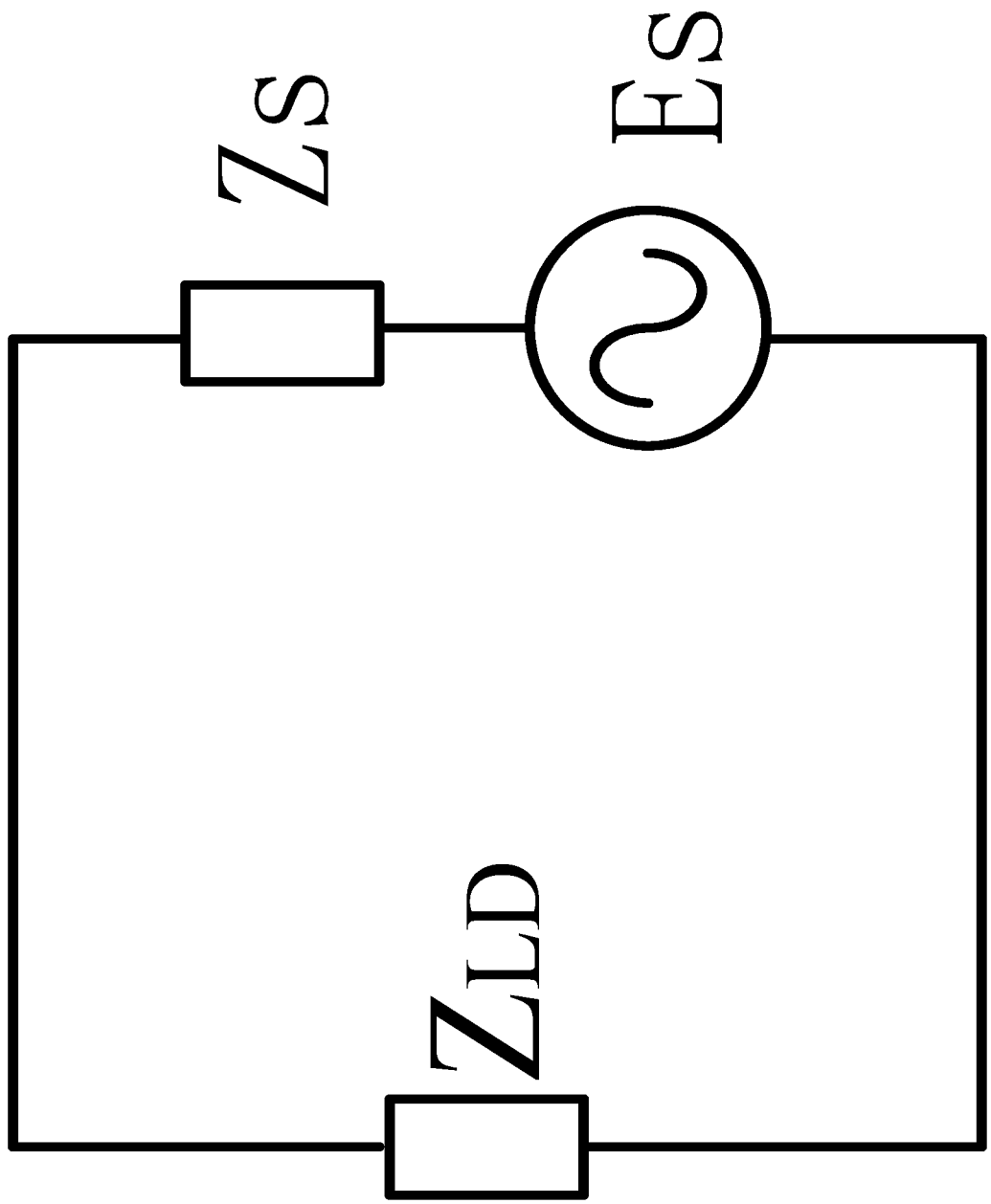
FIG. 6 is a schematic circuit diagram of separate acting of a voltage source according to the present invention.
Figure 7:
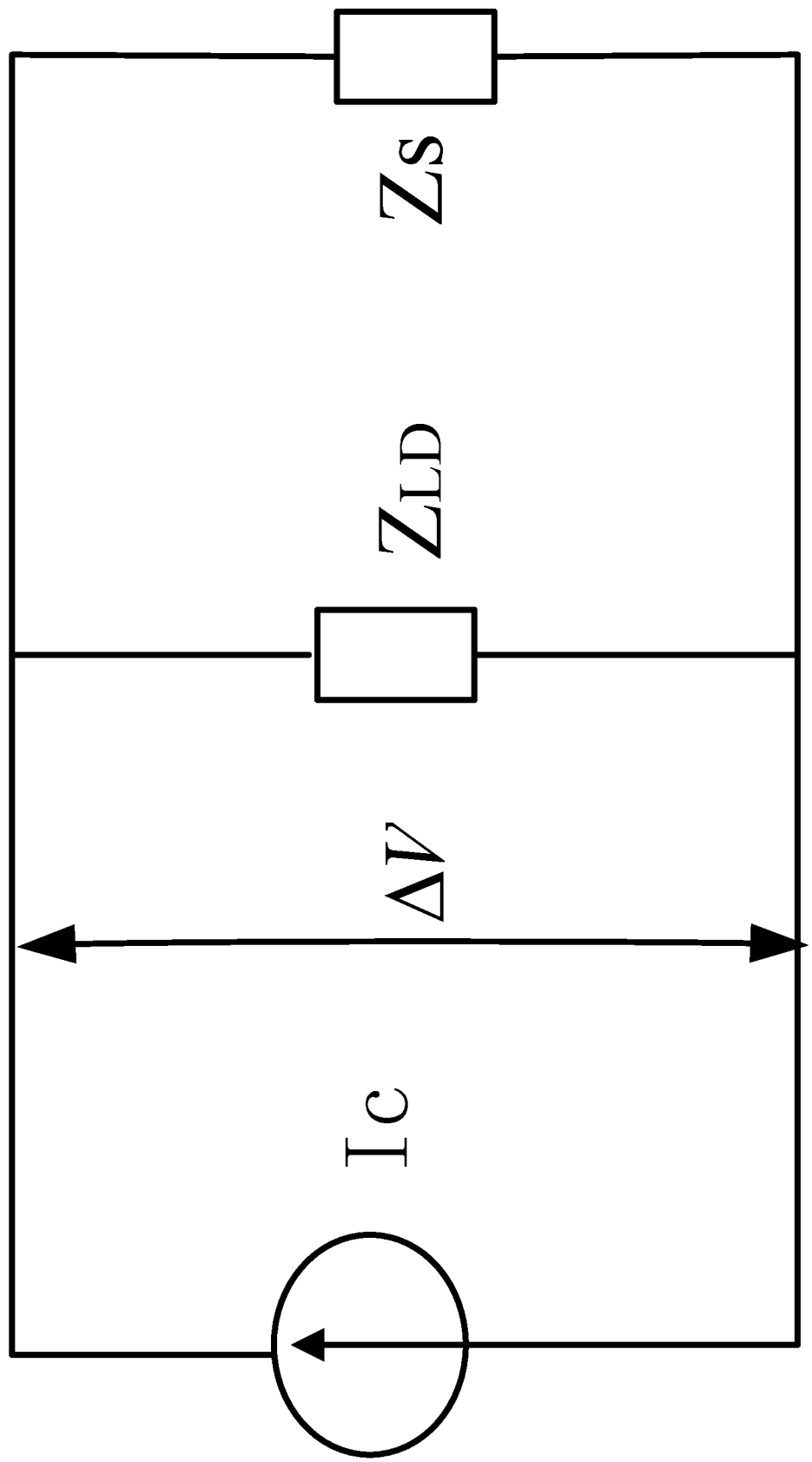
FIG. 7 is a schematic circuit diagram of separate acting of a current source according to the present invention.
Figure 8:
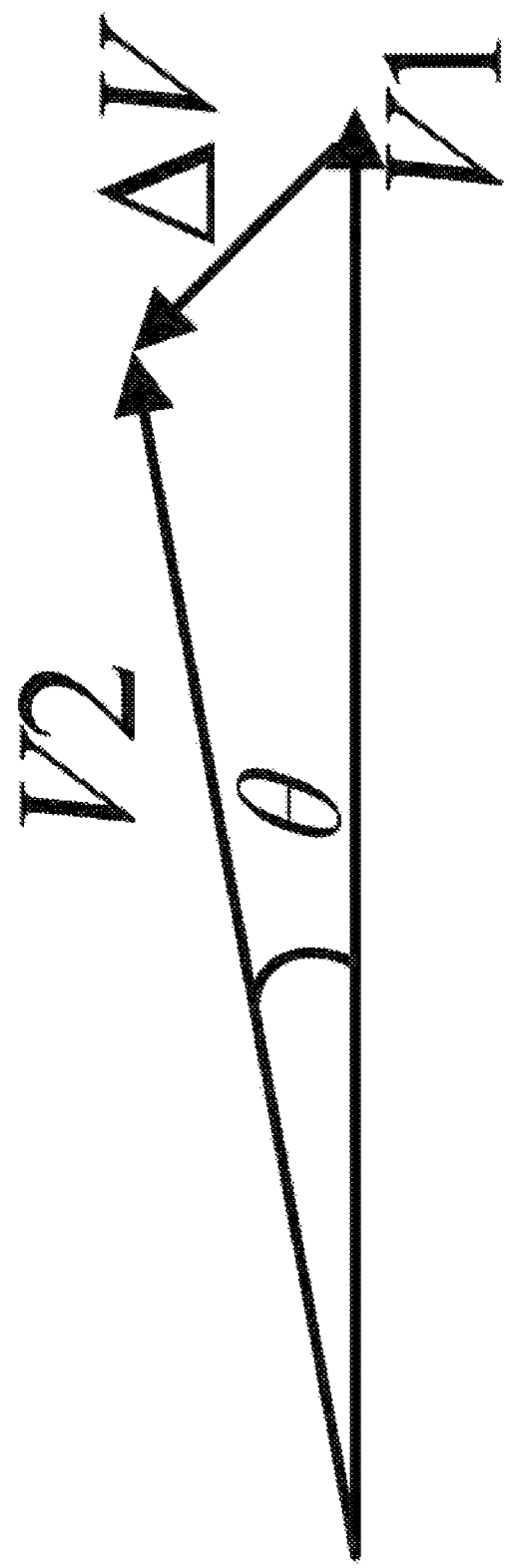
FIG. 8 is a voltage vector diagram of a point of common coupling according to the present invention.

After the capacitor is disconnected, its circuit model is shown in FIG. 6. In this case, the circuit only has an intra-system potential $E_S$ as an excitation source. When a capacitor current separately acts, its circuit model is shown in FIG. 7. In this case, the short-circuit $E_S$ merely has a current source $I_C$ acting on the circuit. It should be noted that this working status only has a strict calculation meaning, and does not correspond to any actual scenario because a power grid that can run under separate acting of a capacitor does not exist. However, this does not affect correctness of the present invention in terms of circuit modeling and calculation method hierarchy.

After measurement is implemented, a voltage effective value $V_1$ before the disconnection from the capacitor, a voltage effective value $V_2$ after the disconnection from the capacitor, and a phase difference θ between the voltage before the disconnection from the capacitor and the voltage after the disconnection from the capacitor can be measured. According to FIG. 4, FIG. 5, and FIG. 6, a phasor diagram shown in FIG. 7 can be obtained.

In FIG. 7, $V_1$ is a PCC voltage before a capacitor is disconnected, $V_2$ is a PCC voltage after the capacitor is disconnected, and $\Delta V$ is a voltage drop when a capacitor-equivalent current source separately acts. Obtaining $\Delta V$ is a key of the present measurement algorithm. According to the phasor diagram shown in FIG. 7, the following formula can be obtained:

$$\Delta V = \sqrt{V_1^2 + V_2^2 - 2V_1 V_2 \cos\theta} \quad (4).$$

A short-circuit capacity S of a PCC at which a parallel reactive compensation device is located is calculated by using measured values of a total active power and a total reactive power that are before the disturbance and (or) that are connected to the PCC.

The following formula is obtained according to FIG. 7:

$$\frac{\Delta V}{Z_{LD}} + \frac{\Delta V}{Z_s} = I_C. \quad (5)$$

Formula (5) is not an empirical formula but is derived from a basic physical principle of circuitry. The measurement principle and method included in formula (5) are completely accurate. $Z_S$ is a system short-circuit impedance, and $I_C$ is a reactive compensation current.

(1), (2), (3), and (4) are substituted into formula (5), from which it could be derived that the short-circuit capacity S of the PCC is:

$$S = \sqrt{\left(\frac{V_1}{\Delta V}\right)^2 Q_C^2 - P_L^2} - Q_L + Q_C \text{ or} \quad (6)$$

$$S = \sqrt{\left(\frac{V_1}{\Delta V}\right)^2 Q_C^2 - P_L^2} - Q_2$$

where $\Delta V = \sqrt{V_1^2 + V_2^2 - 2V_1V_2 \cos\theta}$, C is a reactive compensation device, $Q_C$ is a capacity of a parallel reactive compensation apparatus, $P_L$ and $Q_L$ are a total active power and a reactive power of a load of the PCC before the disturbance, and $Q_2$ is a total reactive power of the load of the PCC after the disturbance. Further, $P_L$ and $Q_L$ may alternatively be obtained by processing measured values $P_1$, $Q_1$, $P_2$, and $Q_2$ of total active powers and total reactive powers connected to the PCC before and after the disturbance.

If the parallel reactive compensation device is a reactor, or if the parallel reactive compensation device measures the short-circuit capacity of the PCC during a connection operation, the principle and the method of the present invention are completely applicable.

To verify feasibility of the present invention, a transformer substation simulation model and a power grid PCC short-circuit capacity tester simulation model that are shown in FIG. 3 are established. The transformer substation model includes a parallel reactive compensation device, a load line, a circuit breaker, and the like. Description of a working status: Based on a simulation whole model of FIG. 7, the to-be-measured PCC, the reactive compensation apparatus, and parameters, such as the load, are set according to a voltage level of 35 kV. Key parameters are set as follows: the to-be-measured PCC is on a voltage level of 35 kV, a frequency of the PCC is equal to a rated frequency 50 Hz, and a three-phase short-circuit capacity is set to 1000 MVA. A load of a transformer substation is (50+j20) MVA. A capacity of a capacitor on which a disconnection operation is performed is 50 MVar. An operation method: When t 6 s, the capacitor is disconnected, voltage effective values of the to-be-measured PCC before and after the capacitor is disconnected and a phase difference between a voltage of the to-be-measured PCC before the capacitor is disconnected and a voltage of the to-be-measured PCC after the capacitor is disconnected are recorded, and the short-circuit capacity of the to-be-measured PCC is calculated according to formula (4) and formula (5).

A measurement result of using the method of the present invention is as follows: a theoretical value of the short-circuit capacity is 1000 MVA, a measured value is 995.2 MVA, and an error is 0.48%.

The non-fault disturbance-based method and system for measuring a short-circuit capacity of a power grid on site provided by the present invention have the following effects: (1) The measurement principle does not cause an error. In the present invention, the formula used for obtaining the short-circuit capacity of the power grid PCC is not an empirical formula but is derived from a basic physical principle of circuitry. Therefore, the measurement principle and method are accurate and would not cause an error. When the short-circuit capacity is actually measured by using the method of the present invention, a measurement error thereof is constituted by a measurement error of an electrical quantity and errors of parameters, such as a load feature and a capacity of a parallel reactive compensation device on which a disconnection operation is performed and is not caused by the method of the present invention. (2) Performing measurement in a non-fault disturbance manner does not affect normal running of power transmission and distribution of a power grid. In the present invention, a short-circuit capacity of a power grid PCC is measured when a parallel reactive compensation apparatus is connected or disconnected, which is a normal operation on a power grid, would not affect power grid safety, and would not affect normal running of power transmission and distribution of the power grid. (3) Measurement on the short-circuit capacity does not limit a running manner of the power grid. With regard to the circuit of the present invention, various situations of an active power and a reactive power at a PCC are taken into consideration, and a measurement principle is universally applicable to various situations of PCC line flows. Measurement is not limited to a specific running manner of a power grid. For example, only under a specific condition that an active power injected to the PCC is 0, a short-circuit capacity can be measured.

The non-fault disturbance-based method and system for measuring a short-circuit capacity of a power grid on site provided by the present invention are applicable to the following several solutions but are not limited to the following several solutions. An implementation solution of a portable system short-circuit capacity tester. The portable system short-circuit capacity tester has all the features of the present invention. It can input relevant parameters, such as a capacity of a reactive compensation device, voltage effective values of a PCC before and after the reactive compensation device is connected or disconnected, a phase difference, and data of active and reactive powers injected to the PCC, required for short-circuit capacity calculation. It usually adopts a manner of manually disconnecting the reactive compensation device. Usually, a manner of using a circuit breaker to perform auxiliary node displacement is used to determine whether the circuit breaker of the reactive compensation device is open, and when the circuit breaker is open, the portable system short-circuit capacity tester is triggered to perform point of coupling voltage testing and to calculate and record a short-circuit capacity and a short-circuit current. In addition, corresponding display and data transmission can be performed. The portable system short-circuit capacity tester has accuracy, rapidity, and simplicity. Each professional of a power sector can perform testing, so that obtaining of a short-circuit current or a short-circuit capacity is no longer limited by only relying on calculation of system professionals as in the past. An implementation solution of a fixed system short-circuit capacity testing terminal: A fixed system short-circuit capacity tester has all the features of the present invention. Designing standards of its industrial cabinet are consistent with those of a reactive compensation device control apparatus, and the fixed system short-circuit capacity tester and the reactive compensation device control apparatus are assembled in a same control screen (cabinet). It can input a capacity of a reactive compensation device, input, communicably transmit, or measure relevant parameters, such as the capacity of the reactive compensation device, voltage effective values of a PCC before and after a reactive compensation device is connected or disconnected, a phase difference, and data of active and reactive powers injected to the PCC, required for short-circuit capacity calculation. It adopts a manner of manually disconnecting a reactive compensation device by using a circuit breaker.

Usually, a composite logic determining manner of using a circuit breaker to perform an operation on a trip signal, an auxiliary node displacement, or a current status of the reactive compensation apparatus is adopted to determine whether the circuit breaker of the reactive compensation device performs a tripping operation and is reliably open, to ensure that the reactive compensation device is disconnected when the power grid is in a normal state. Sort-circuit capacity testing is automatically performed in an unattended state, to ensure correctness and accuracy of experimental data such as a short-circuit capacity. When the circuit breaker is open, the portable system short-circuit capacity tester is triggered to perform point of coupling voltage testing and calculate and record a short-circuit capacity and a short-circuit current. In addition, corresponding display and data transmission can be performed. For example, if the fixed system short-circuit capacity testing terminal is used, when being started in emergency, a direct-current converter station can quickly learn whether a short-circuit ratio condition is satisfied, to prevent a resonance over-voltage, so that a power grid control system is safer and more reliable. An online short-circuit capacity/short-circuit current measurement and collection system of a fixed system short-circuit capacity testing terminal is used. The fixed system short-circuit capacity testing terminal has a full-duplex data communication function, and can send a short-circuit capacity and a short-circuit current that are recently tested to a data background, the data background publishes data of all testing points for use of all professionals of a power grid. By means of an online short-circuit capacity monitoring system, in an abnormal power grid state, a short-circuit capacity of the PCC is provided quickly, and whether a protection setting of relay protection of a power grid is mismatched can be found in real time. Auto-tuning and self-adaptation of replay protection and relay protection maintenance-free technologies and devices are expanded based on a short-circuit capacity measurement method of the present invention.

A relay protection apparatus forms a short-circuit capacity measurement function by being embedded with the method of the present invention, or receives, by means of communication, a short-circuit capacity measured by a fixed apparatus using the method of the present invention. A setting value of the short-circuit capacity measured by the replay protection apparatus according to the method of the present invention is automatically calculated and updated according to the relay protection tuning principle, to implement auto-tuning of the relay protection, power grid self-adaptation, and relay protection maintenance-free technologies. Usually, in a power distribution grid where running manners are adjusted and switched frequently, where there are a lot of devices, and where maintenance is difficult, relay protection auto-tuning and self-adaptation technologies and devices based on the short-circuit capacity measurement method of the present invention have great application values.

Figure 9:
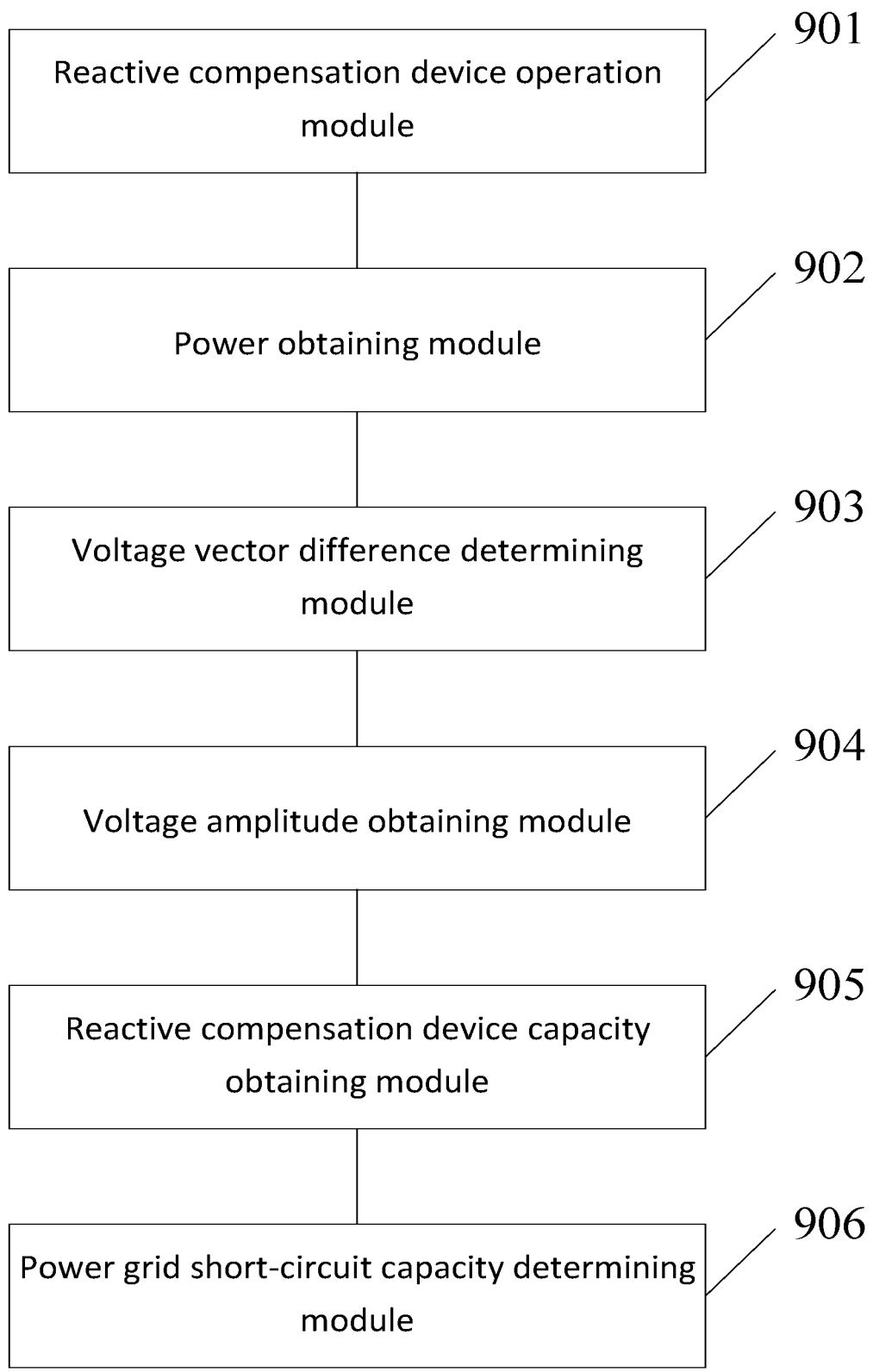
FIG. 9 is a structural diagram of a non-fault disturbance-based system for measuring a short-circuit capacity of a power grid on site according to an embodiment of the present invention. 1 voltage source $E_S$; 2 system short-circuit impedance $Z_S$; 3 reactive compensation device; 4 circuit breaker; 5 load impedance $Z_{LD}$; 6 power grid point of common coupling PCC.

FIG. 9 is a structural diagram of a non-fault disturbance-based system for measuring a short-circuit capacity of a power grid on site according to an embodiment of the present invention. As shown in FIG. 9, the non-fault disturbance-based system for measuring a short-circuit capacity of a power grid on site provided by the present invention includes: a reactive compensation device operation module 901, configured to connect or disconnect a reactive compensation device to or from a power grid point of common coupling, to generate a disturbance on a power grid, where the reactive compensation device is a reactive compensation device of the power grid; a power obtaining module 902, configured to obtain a total active power and a total reactive power of a load of the point of common coupling before the disturbance; a voltage vector difference determining module 903, configured to determine a vector difference between a voltage of the power grid point of common coupling before the disturbance and a voltage of the power grid point of common coupling after the disturbance; a voltage effective value obtaining module 904, configured to obtain a voltage effective value of the power grid point of common coupling before the disturbance; a reactive compensation device capacity obtaining module 905, configured to obtain a capacity of the reactive compensation device; and a power grid point of common coupling short-circuit capacity determining module 906, configured to determine a short-circuit capacity of the point of common coupling according to the total active power, the total reactive power, the vector difference between the voltages, the voltage effective value, and the capacity of the reactive compensation device.

The voltage vector difference determining module 903 specifically includes: a pre-operation voltage obtaining unit, configured to obtain the voltage effective value and a phase of the power grid point of common coupling before the disturbance; a post-operation voltage obtaining unit, configured to obtain a voltage effective value and a phase of the power grid point of common coupling after the disturbance; and a voltage vector difference calculation unit, configured to obtain the vector difference between the voltages of the power grid point of common coupling according to $\Delta V = \sqrt{V_1^2 + V_2^2 - 2V_1V_2 \cos\theta}$, where $\Delta V$ is the vector difference between the voltages of the power grid point of common coupling, $V_1$ is the voltage effective value of the power grid point of common coupling before the disturbance, $V_2$ is the voltage effective value of the power grid point of common coupling after the disturbance, and $\theta$ is a phase difference between the voltage of the power grid point of common coupling before the disturbance and the voltage of the power grid point of common coupling after the disturbance.

The power grid point of common coupling short-circuit capacity determining module 906 specifically includes: a power grid point of common coupling short-circuit capacity determining unit, configured to calculate the short-circuit capacity of the point of common coupling according to $$S = \sqrt{\left(\frac{V_1}{\Delta V}\right)^2 Q_C^2 - P_L^2} - Q_L + Q_C,$$

where S is the short-circuit capacity of the power grid point of common coupling, $Q_C$ is the capacity of the connected or disconnected reactive compensation device, $P_L$ is the total active power of the load of the point of common coupling, $Q_L$ is the total reactive power of the load of the point of common coupling before the disturbance, and V is the voltage effective value of the power grid point of common coupling before the disturbance.

In the non-fault disturbance-based system for measuring a short-circuit capacity of a power grid on site provided by the present invention, a connected reactive compensation device is connected to or disconnect from a power grid point of common coupling, to generate a disturbance on a power grid; a total active power and a total reactive power of a load of the point of common coupling before the disturbance, as well as amplitude and phase differences between a voltage of the power grid point of common coupling before the disturbance and a voltage of the power grid point of common coupling after the disturbance are measured; and a short-circuit capacity of the point of common coupling is calculated according to the total active power and the total reactive power of the load of the point of common coupling, the amplitude and phase differences between the voltage of the power grid point of common coupling before the disturbance and the voltage of the power grid point of common coupling after the disturbance, and the capacity of the connected or disconnected reactive compensation device, so as to implement online measurement of the short-circuit capacity of the power grid point of common coupling. In addition, because a formula used for calculating the short-circuit capacity of the power grid point of common coupling in the present invention is derived from a basic physical principle of circuitry and is not an empirical formula, the short-circuit capacity of the power grid point of common coupling calculated in the present invention has an advantage of high precision.

Each embodiment of the present specification is described in a progressive manner, each embodiment focuses on the difference from other embodiments, and the same and similar parts between the embodiments may refer to each other. For a system disclosed in the embodiments, since it corresponds to the method disclosed in the embodiments, the description is relatively simple, and reference can be made to the method description.

Several examples are used for illustration of the principles and implementation methods of the present invention. The description of the embodiments is used to help illustrate the method and its core principles of the present invention. In addition, those skilled in the art can make various modifications in terms of specific embodiments and scope of application in accordance with the teachings of the present invention. In conclusion, the content of this specification shall not be construed as a limitation to the invention.

We claim:

1. A non-fault disturbance-based method for measuring a short-circuit capacity of a power grid on site, comprising:
    connecting or disconnecting, by a circuit breaker, a reactive compensation device to or from a power grid point of common coupling, to generate a disturbance on the power grid, wherein the reactive compensation device is a reactive compensation device of the power grid;
    by a short-circuit capacity tester, obtaining a total active power and a total reactive power of a load of the power grid point of common coupling before the disturbance;
    determining a vector difference between a voltage of the power grid point of common coupling before the disturbance and a voltage of the power grid point of common coupling after the disturbance;
    obtaining a voltage effective value of the power grid point of common coupling before the disturbance;
    obtaining a capacity of the reactive compensation device; and
    determining the short-circuit capacity of the power grid point of common coupling according to the total active power, the total reactive power, the vector difference between the voltage of the power grid point of common coupling before the disturbance and the voltage of the power grid point of common coupling after the disturbance, the voltage effective value, and the capacity of the reactive compensation device; and
    by a relay protection apparatus, performing a relay protection auto-tuning according to the short-circuit capacity.

2. The non-fault disturbance-based method for measuring the short-circuit capacity of the power grid on site according to claim 1, wherein determining the vector difference between the voltage of the power grid point of common coupling before the disturbance and the voltage of the power grid point of common coupling after the disturbance specifically comprises:
    by the short-circuit capacity tester,
    obtaining the voltage effective value and a phase of the power grid point of common coupling before the disturbance;
    obtaining a voltage effective value and a phase of the power grid point of common coupling after the disturbance; and
    calculating the vector difference between the voltage of the power grid point of common coupling before the disturbance and the voltage of the power grid point of common coupling after the disturbance according to $\Delta V=\sqrt{V_1^2+V_2^2-2V_1V_2\cos\theta}$, where $\Delta V$ is the vector difference between the voltage of the power grid point of common coupling before the disturbance and the voltage of the power grid point of common coupling after the disturbance, $V_1$ is the voltage effective value of the power grid point of common coupling before the disturbance, $V_2$ is the voltage effective value of the power grid point of common coupling after the disturbance, and $\theta$ is a phase difference between the voltage of the power grid point of common coupling before the disturbance and the voltage of the power grid point of common coupling after the disturbance.

3. The non-fault disturbance-based method for measuring the short-circuit capacity of the power grid on site according to claim 1, wherein determining the short-circuit capacity of the power grid point of common coupling according to the total active power, the total reactive power, the vector difference between the voltage of the power grid point of common coupling before the disturbance and the voltage of the power grid point of common coupling after the disturbance, the voltage effective value, and the capacity of the reactive compensation device specifically comprises:
    by the short-circuit capacity tester,
    calculating the short-circuit capacity of the power grid point of common coupling according to $$S = \sqrt{\left(\frac{V_1}{\Delta V}\right)^2 Q_C^2 - P_L^2} - Q_L + Q_C,$$

wherein S is the short-circuit capacity of the power grid point of common coupling, $Q_C$ is the capacity of the connected or disconnected reactive compensation device, $P_L$ is the total active power of the load of the power grid point of common coupling, $Q_L$ is the total reactive power of the load of the power grid point of common coupling, $V_1$ is the voltage effective value of the power grid point of common coupling before the disturbance, and $\Delta V$ is the vector difference between the voltage of the power grid point of common coupling before the disturbance and the voltage of the power grid point of common coupling after the disturbance.

4. A non-fault disturbance-based system for measuring a short-circuit capacity of a power grid on site, comprising:

a circuit breaker, configured to connect or disconnect a reactive compensation device to or from a power grid point of common coupling, to generate a disturbance on the power grid, wherein the reactive compensation device is a reactive compensation device of the power grid;

a short-circuit capacity tester, configured to:
(a) obtain a total active power and a total reactive power of a load of the power grid point of common coupling before the disturbance;
(b) determine a vector difference between a voltage of the power grid point of common coupling before the disturbance and a voltage of the power grid point of common coupling after the disturbance;
(c) obtain a voltage effective value of the power grid point of common coupling before the disturbance;
(d) obtain a capacity of the reactive compensation device;
(e) determine the short-circuit capacity of the power grid point of common coupling according to the total active power, the total reactive power, the vector difference between the voltage of the power grid point of common coupling before the disturbance and the voltage of the power grid point of common coupling after the disturbance, the voltage effective value, and the capacity of the reactive compensation device; and a relay protection apparatus, configured to perform a relay protection auto-tuning according to the short-circuit capacity.

5. The non-fault disturbance-based system for measuring the short-circuit capacity of the power grid on site according to claim 4, wherein the short-circuit capacity tester is further configured to:
obtain the voltage effective value and a phase of the power grid point of common coupling before the disturbance;
obtain a voltage effective value and a phase of the power grid point of common coupling after the disturbance; and
obtain the vector difference between the voltage of the power grid point of common coupling before the disturbance and the voltage of the power grid point of common coupling after the disturbance according to $\Delta V = \sqrt{V_1^2 + V_2^2 - 2V_1 V_2 \cos\theta}$, wherein $\Delta V$ is the vector difference between the voltage of the power grid point of common coupling before the disturbance and the voltage of the power grid point of common coupling after the disturbance, $V_1$ is the voltage effective value of the power grid point of common coupling before the disturbance, $V_2$ is the voltage effective value of the power grid point of common coupling after the disturbance, and $\theta$ is a phase difference between the voltage of the power grid point of common coupling before the disturbance and the voltage of the power grid point of common coupling after the disturbance.

6. The non-fault disturbance-based system for measuring the short-circuit capacity of the power grid on site according to claim 4, wherein the short-circuit capacity tester is further configured to:
calculate the short-circuit capacity of the power grid point of common coupling according to $$S = \sqrt{\left(\frac{V_1}{\Delta V}\right)^2 Q_C^2 - P_L^2} - Q_L + Q_C,$$

wherein S is the short-circuit capacity of the power grid point of common coupling, $Q_C$ is the capacity of the connected or disconnected reactive compensation device, $P_L$ is the total active power of the load of the power grid point of common coupling, $Q_L$ is the total reactive power of the load of the power grid point of common coupling before the disturbance, $V_1$ is the voltage effective value of the power grid point of common coupling before the disturbance, and $\Delta V$ is the vector difference between the voltage of the power grid point of common coupling before the disturbance and the voltage of the power grid point of common coupling after the disturbance.

\* \* \* \* \*